(12) United States Patent
Yuan et al.

(10) Patent No.: US 8,735,050 B2
(45) Date of Patent: May 27, 2014

(54) INTEGRATED CIRCUITS AND METHODS FOR FABRICATING INTEGRATED CIRCUITS USING DOUBLE PATTERNING PROCESSES

(75) Inventors: Lei Yuan, Sunnyvale, CA (US); Hidekazu Yoshida, San Jose, CA (US); Jongwook Kye, Pleasanton, CA (US); Qi Xiang, San Jose, CA (US); Mahbub Rashed, Santa Clara, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/567,233

(22) Filed: Aug. 6, 2012

(65) Prior Publication Data
US 2014/0035151 A1 Feb. 6, 2014

(51) Int. Cl.
*G03F 1/00* (2012.01)
*G06F 17/50* (2006.01)

(52) U.S. Cl.
USPC ............................................. 430/311; 716/55

(58) Field of Classification Search
USPC ............. 430/5, 311, 312, 313; 716/51, 54, 55
See application file for complete search history.

(56) References Cited

U.S. PATENT DOCUMENTS

| 8,245,174 B2* | 8/2012 | Cheng et al. | 716/126 |
| 2012/0319287 A1* | 12/2012 | Huang et al. | 257/773 |

* cited by examiner

*Primary Examiner* — Stephen Rosasco
(74) *Attorney, Agent, or Firm* — Ingrassia Fisher & Lorenz, P.C.

(57) ABSTRACT

Integrated circuits and methods for fabricating integrated circuits are provided. One method includes creating a master pattern layout including first and second adjacent cells. The first adjacent cell has a first border pin with a first routing line. The second adjacent cell has a second border pin with a second routing line. The first and second routing lines overlap to define an edge-edge stitch to couple the first and second border pins. The master pattern layout is decomposed into sub-patterns.

18 Claims, 5 Drawing Sheets

FIG. 7

INTEGRATED CIRCUITS AND METHODS FOR FABRICATING INTEGRATED CIRCUITS USING DOUBLE PATTERNING PROCESSES

TECHNICAL FIELD

The technical field relates generally to integrated circuits and methods for fabricating integrated circuits, and more particularly relates to integrated circuits and methods for fabricating integrated circuits using double patterning processes.

BACKGROUND

There is a continuing trend within the microelectronics industry to incorporate more circuitry having greater complexity on a single integrated circuit (IC) chip. Maintaining this trend generally entails shrinking the size of individual devices within the circuit by reducing the critical dimensions (CDs) of device elements along with the pitch, or the CD of such an element added to the spacing between elements. As used herein, the term "critical dimension(s)" refers to the smallest width or dimension of a line, hole, or space between two lines or two holes that is defined in a predetermined set of design rules for designing an integrated circuit. Microlithography tooling and processing techniques play an important role in resolving the features necessary to fabricate devices and, accordingly, are continually under development to meet industry milestones relating to the CD and pitch characteristics of each new technology generation.

High numerical aperture (NA) 193 nanometer (nm) optical projection stepper/scanner systems in combination with advanced photoresist processes are now capable of routinely resolving complex patterns that include isolated and dense resist features having CDs and pitches, respectively, well below the exposure wavelength. However, to meet the requirements of device design rules, which continue to push the resolution limits of existing processes and tooling, other more specialized techniques have been developed to further enhance resolution. These include double patterning techniques in which device patterns having potentially optically unresolvable features are decomposed into two or more complementary, and more easily resolvable patterns, each containing features with larger CDs and/or a relaxed pitch.

To use double patterning techniques, a target pattern layout, e.g., master pattern layout, must be double patterning compliant. In general, this means that the target pattern layout can be decomposed into two separate patterns that each may be printed in a single layer using existing photolithography tools. A target pattern layout may have many regions or areas that cannot be printed because the features in those areas are spaced too close to one another for existing photolithography tools to be able to print such closely spaced features as individual features. To the extent a target pattern layout has an even number of such regions, such a pattern is sometimes referred to as an "even cycle" pattern, while a target pattern layout that has an odd number of such regions is sometimes referred to as an "odd cycle" pattern. Even cycle patterns can be formed using double patterning techniques, while odd cycle patterns cannot be formed using double patterning techniques. In some target patterns, odd cycles can be removed by applying metal stitching, which is a process for breaking one polygon into two overlapping polygons that are patterned on separate single layers.

An integrated circuit includes a plurality of cells that each comprises a plurality of metal line type features arranged to provide a particular logic function of the circuit. The cells need to be connected by metal lines to generate the integrated circuit, which is often done by EDA tools called Routers. Double patterning technology is commonly used to define the dense metal routing layers in 20 nm and 14 nm technologies. Often, adjacent cells need to be coupled. One approach is to define a back-to-back (B2B) route between border pins (e.g., metal line type features that border their respective cells) of the adjacent cells in the same metal layer, e.g., often the first metal layer, as border pins. The width of the B2B metal route line is often the minimum critical dimension of the metal line width. In double patterning technology, it can happen that the B2B metal route line introduces odd cycles that make the resulted metal layout not decomposable. To maintain the decomposability of the resulted metal routing layer, a metal stitch on the B2B metal connection is often needed. Unfortunately, typical design rules for spacing and end-end stitches require significant space for such B2B routes that are often not compatible with double patterning technology, thereby limiting the decomposability of many target or master pattern layouts into two or more complementary patterns. As such, routing between the various cells becomes more complicated and can lead to routing congestion.

Accordingly, it is desirable to provide integrated circuits and methods for fabricating integrated circuits that are compatible with double patterning processes and allow B2B routing in a single layer, e.g., first metal layer, of an integrated circuit. Moreover, it is desirable to provide integrated circuits and methods for fabricating integrated circuits that help reduce routing congestion. Furthermore, other desirable features and characteristics of the present invention will become apparent from the subsequent detailed description and the appended claims, taken in conjunction with the accompanying drawings and the foregoing technical field and background.

BRIEF SUMMARY

Integrated circuits and methods for fabricating integrated circuits are provided herein. In accordance with an exemplary embodiment, a method for fabricating an integrated circuit includes creating a master pattern layout for a semiconductor device layer. The master pattern layout includes a first adjacent cell and a second adjacent cell each configured for providing a particular logic function. The first adjacent cell has a first border pin with a first routing line extending therefrom. The second adjacent cell has a second border pin with a second routing line extending therefrom. The first routing line has a first predetermined line width and the second routing line has a second predetermined line width. The first and second predetermined line widths are about 40 nm or greater. The first and second routing lines overlap to define an edge-edge stitch to couple the first and second border pins. The master pattern layout is decomposed into a first sub-pattern and a second sub-pattern. The first sub-pattern includes the first border pin with the first routing line and the second sub-pattern includes the second border pin with the second routing line. A first set of mask data is generated corresponding to the first sub-pattern. A second set of mask data is generated corresponding to the second sub-pattern.

In accordance with another exemplary embodiment, a method for fabricating an integrated circuit is provided. The method includes patterning a layer of mask material overlying a semiconductor device layer using a first photomask and a double patterning process to transfer a first sub-pattern from the first photomask to the layer of mask material. The first sub-pattern includes a first border pin with a first routing line extending therefrom. The first routing line has a first predetermined line width that is about 40 nm or greater. The layer of mask material is patterned using a second photomask and the double patterning process to transfer a second sub-pattern from the second photomask to the layer of mask material. The second sub-pattern includes a second border pin with a second routing line extending therefrom. The second routing line has a second predetermined line width that is about 40 nm or greater. The layer of the mask material is patterned using the first and second photomasks such that the first and second routing lines overlap to define an edge-edge stitch to couple the first and second border pins.

In accordance with another exemplary embodiment, an integrated circuit is provided. The integrated circuit includes a semiconductor device layer. The semiconductor device layer includes a first adjacent cell and a second adjacent cell that are each configured for providing a particular logic function. The first adjacent cell has a first border pin with a first routing line extending therefrom. The second adjacent cell has a second border pin with a second routing line extending therefrom. The first routing line has a first predetermined line width and the second routing line has a second predetermined line width. The first and second predetermined line widths are about 40 nm or greater. The first and second routing lines are connected via an edge-edge stitch to couple the first and second border pins.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to integrated circuits and methods for fabricating integrated circuits using double patterning processes. In an exemplary embodiment, a master pattern layout is created for a semiconductor device layer, e.g., a metal layer of a semiconductor device. The master pattern layout includes a first adjacent cell and a second adjacent cell each configured for providing a particular logic function. The first adjacent cell has a first border pin with a first routing line extending laterally therefrom. The second adjacent cell has a second border pin with a second routing line extending laterally therefrom. The first border pin has a first predetermined pin width and the second border pin has a second predetermined pin width. The two border pins are connected by a metal routing line (B2B metal route line) that is significantly wider than the minimum metal line width (critical dimension), such as, for example, about two times or greater than the minimum metal line width. In an exemplary embodiment, the metal routing line is about 40 nm or greater. The type of stitch formed on this wide B2B metal route line is defined as an edge-edge stitch. Design rules for edge-edge stitches require less overall space and overlap of the routing lines than do end-end stitches, which are formed on narrower overlapping routing lines. Therefore, the decomposability of the master plan layout is less limited compared to other master pattern layout that include end-end stitches for coupling border pins and accordingly, the master plan layout with the edge-edge stitch(es) is more compatible with double patterning processes and results in less routing congestion.

Figure 1:
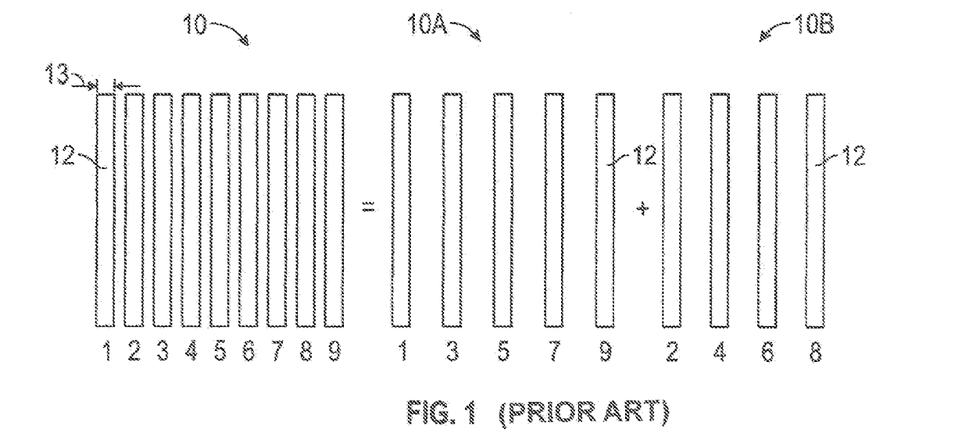
FIG. 1 illustrates an example of a double patterning process.

Referring to FIG. 1, an illustrative double patterning process is provided together with the following brief explanation to identify some of the unique features of double patterning technology. As illustrated, a master pattern layout 10 (e.g., design layout created with a computer aided design (CAD) program or the like) includes nine features 12 that are correspondingly numbered 1-9. Each of the features 12 has the same critical dimension (indicated by arrows 13). The space between the features 12 in the master pattern layout 10 is such that the master pattern layout 10 cannot be printed using a single mask with available photolithography tools. The space in the master pattern layout 10 is often called as "different color space" or "different mask space." As such, the master pattern layout 10 is decomposed into a sub-pattern 10A including features 1, 3, 5, 7, and 9 and a sub-pattern 10B including features 2, 4, 6, and 8. The sub-patterns 10A and 10B are referred to as "sub-patterns" because each of them contains less than all of the features 12 in the master pattern layout 10. The features 12 that are incorporated in the sub-patterns 10A and 10B are selected and spaced such that the sub-patterns 10A and 10B may be readily formed in a single masking layer using available photolithography tools. The space between the features 12 in the sub patterns is often called as "same color space" or "same mask space." Ultimately, when the mask design process is completed, data corresponding to the sub-patterns 10A and 10B (modified as necessary during the design process) will be provided to a mask manufacture that will produce tangible photomasks (not shown) corresponding to sub-patterns 10A and 10B to be used in a photolithography tool to manufacture integrated circuit products.

Figure 2A:
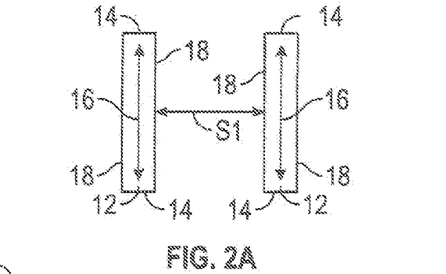
FIGS. 2A-2C illustrate design rules for minimum space of single patterning between lines in accordance with an exemplary embodiment.
Figure 2B:
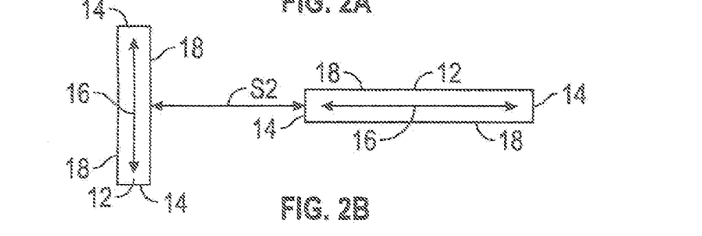
Figure 2C:
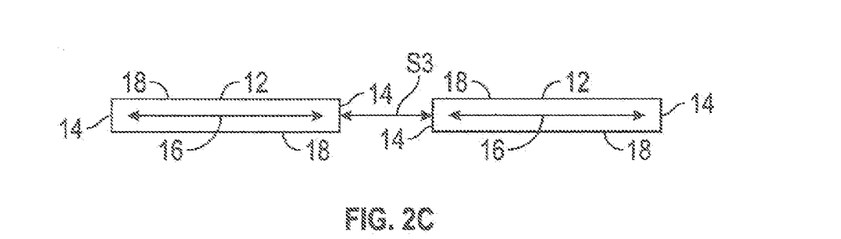

FIGS. 2A-2C illustrate design rules for minimum space between lines for a sub-pattern layout in accordance with an exemplary embodiment. As illustrated, the features 12 have tips 14 that are transverse to long-axes 16 and edges 18 that are parallel to the long-axes 16. FIG. 2A defines the minimum space (designated by double headed arrow S1) between the edges 18 of two adjacent features 12 as the "edge-to-edge minimum space." FIG. 2B defines the minimum space (designated by double headed arrow S2) between the edge 18 and the tip 14 of two adjacent features 12 as the "tip-to-edge minimum space." FIG. 2C defines the minimum space (designated by double headed arrow S3) between the tips 14 of two adjacent features 12 as the "tip-to-tip minimum space." The design rule for minimum space between lines defines the edge-to-edge minimum space S1 as less than the tip-to-edge minimum space S2, which is less than the tip-to-tip minimum space S3 (i.e., S1<S2<S3). In an exemplary embodiment, the edge-to-edge minimum space S1 is from about 50 to about 70 nm, the tip-to-edge minimum space S2 is from about 70 to about 80 nm, and the tip-to-tip minimum space S3 is about 85 nm or greater, for example about 90 to about 100 nm.

Figure 3A:
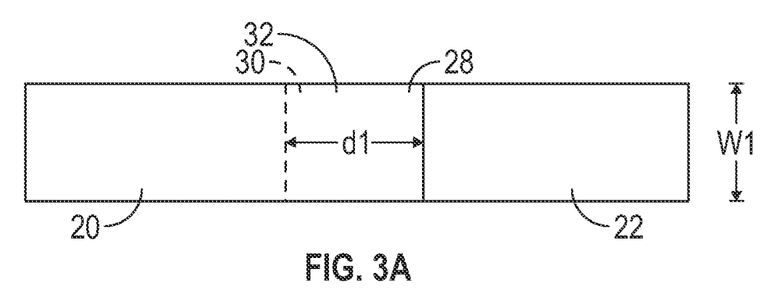
FIGS. 3A-3B illustrate design rules for line overlap stitches in accordance with an exemplary embodiment.
Figure 3B:
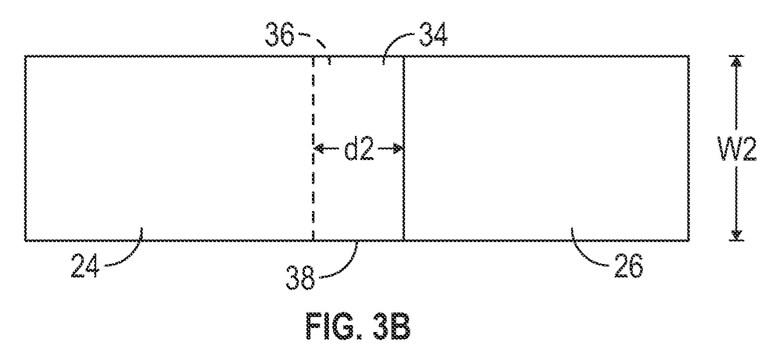

FIGS. 3A-3B illustrate design rules for line overlap stitches for a master pattern layout in accordance with an exemplary embodiment. As illustrated, routing lines 20 and 22, which may be used for example to couple adjacent features 12 as will be discussed in further detail below, have a relatively narrow width (designated by double headed arrow W1) compared to routing lines 24 and 26, which have a relatively wide width (designated by double headed arrow W2). In an exemplary embodiment, the routing lines 20 and 22 have the same critical dimension for the width W1 and the routing lines 24 and 26 have the same dimension that is greater than the critical dimension for the width W2, such as about 1.5 times or greater (e.g., about 2 times or greater) than the width W1 of the routing lines 20 and 22. In one example, the routing lines 20 and 22 have the width W1 of about 30 to about 40 nm and the routing lines 24 and 26 have the width W2 of about 40 nm or greater, such as about 50 nm or greater, such as about 60 nm or greater, such as from about 60 to about 100 nm, for example from about 60 to about 80 nm.

As illustrated in FIG. 3A, the end portion 28 of the routing line 20 overlaps the end portion 30 of the routing line 22 by an overlap distance (indicated by double headed arrow d1) to define an end-end stitch 32 that connects the routing lines 20 and 22 together. As used herein, the term "end-end stitch" is a stitch (e.g., overlapping routing lines or other features) that is formed when routing lines that have a relatively narrow width of substantially about the critical dimension overlap along their widths. Likewise and as illustrated in FIG. 3B, the end portion 34 of the routing line 24 overlaps the end portion 36 of the routing line 26 by an overlap distance (indicated by double headed arrow d2) to define an edge-edge stitch that connects the routing lines 24 and 26 together. As used herein, the term "edge-edge stitch" is a stitch (e.g., overlapping routing lines or other features) that is formed when routing lines that have a relatively wide width of substantially greater than about the critical dimension overlap along their widths. The design rule for line overlap stitches defines the overlap distance of the end-end stitch as greater than the overlap distance of the edge-edge stitch (i.e. d1>d2). In an exemplary embodiment, the overlap distance of the end-end stitch (d1) is about 2 times or greater than the overlap distance of the edge-edge stitch (d2). In one example, the overlap distance of the end-end stitch (d1) is about 60 nm or greater, such as from about 60 to about 80 nm, and the overlap distance of the edge-edge stitch (d2) is about 40 nm or less, such as from about 30 to about 40 nm.

Figure 5:
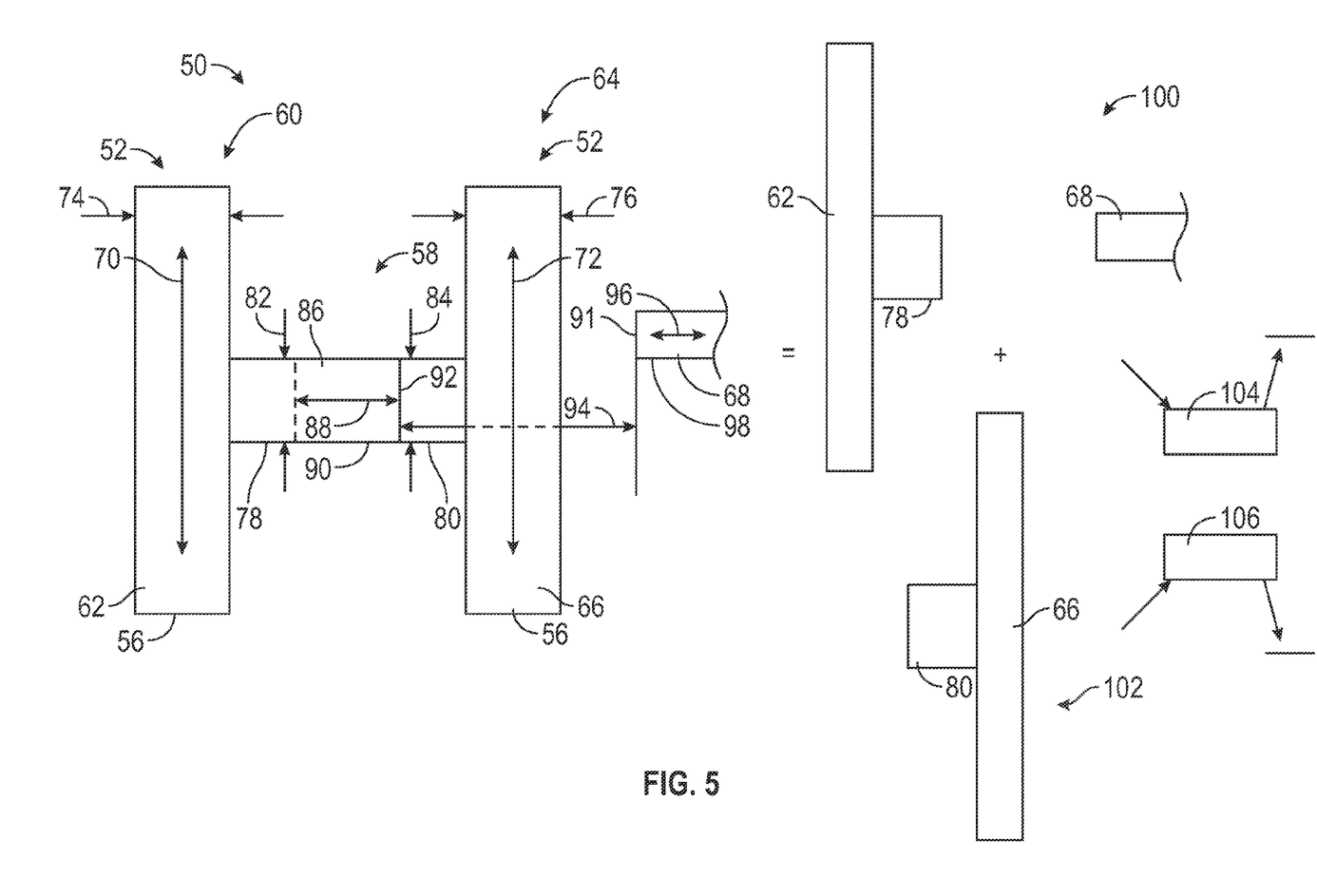
Figure 6:
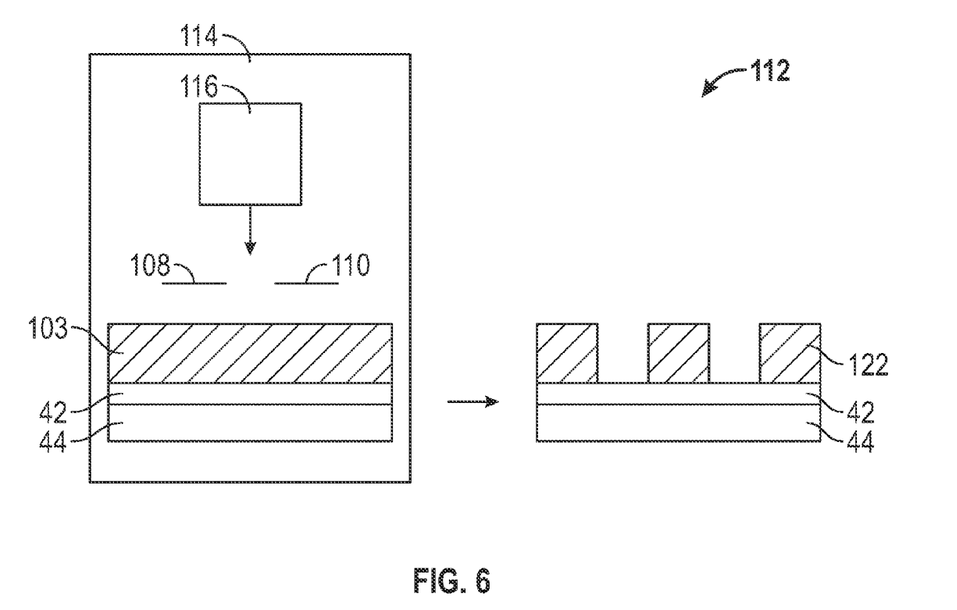
Figure 7:
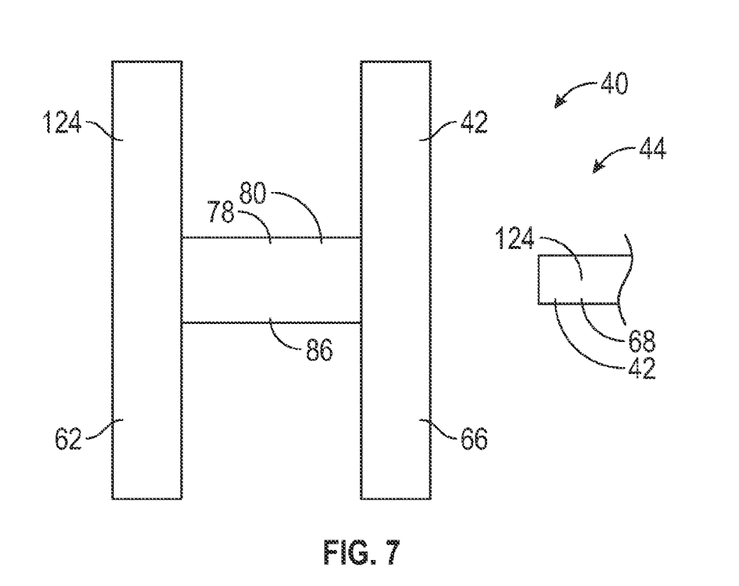

FIGS. 4-7 illustrate methods for fabricating an integrated circuit (IC) 40 in accordance with various embodiments. The described process steps, procedures, and materials are to be considered only as exemplary embodiments designed to illustrate to one of ordinary skill in the art methods for practicing the invention; the invention is not limited to these exemplary embodiments. The illustrated portion of the IC 40 at a later stage of fabrication, as shown in FIG. 7, includes only a single semiconductor device layer 42 overlying a semiconductor substrate 44, although those of skill in the art will recognize that an actual IC could include a large number of such semiconductor device layers. Various steps in the manufacture of ICs are well known and so, in the interest of brevity, many conventional steps will only be mentioned briefly herein or will be omitted entirely without providing the well known process details.

Figure 4:
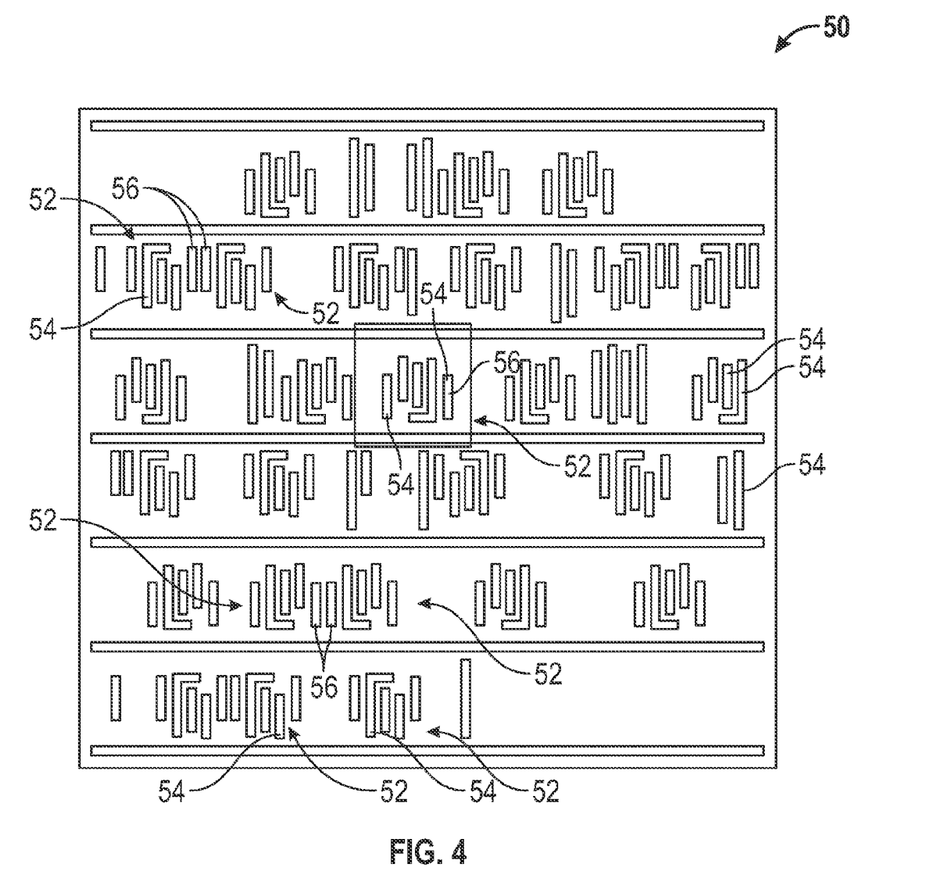
FIGS. 4-7 illustrate methods for fabricating integrated circuits in accordance with various embodiments.

FIG. 4 illustrates, in plan view, a master pattern layout 50 for a semiconductor device layer 42 (see FIGS. 6-7) at an early design phase for the fabrication of the IC 40 in accordance with an exemplary embodiment. The master pattern layout 50 includes a plurality of cells 52 that may, for example, be selected from a standard CAD library for integrated circuit design. Each of the cells 52 has a plurality of features 54 that are arranged to provide intra-cell or inter-cell device connections as is well known in the art for the respective cell 52. As illustrated, some of the features 54 that border the perimeter of their respective cell 52 form border pins 56 that are to be interconnected with other border pins 56 of adjacent cells 52.

FIG. 5 illustrates, in plan view, the master pattern layout 50 at further advanced design phases in accordance with an exemplary embodiment. A portion of the master pattern layout 50 has two adjacent cells 52 that include border pins 56 that are interconnected via a B2B route 58. As illustrated, the portion of the master pattern layout 50 includes a cell 60 with a border pin 62 and a cell 64 with a border pin 66. As will be discussed in further detail below, the cell 64 also includes an intermediate feature 68 that is adjacent to the border pin 66 on a side opposite the border pin 62.

The border pins 62 and 66 have corresponding long axes 70 and 72 and, as illustrated, are substantially parallel to each other. The border pins 62 and 66 have predetermined pin widths (indicated by arrows 74 and 76) that are transverse to the long axes 70 and 72, respectively. In an exemplary embodiment, the border pins 62 and 66 have the same critical dimension for the predetermined pin widths 74 and 76.

Extending from the border pins 62 and 66 and towards each other are routing lines 78 and 80, respectively. The routing lines 78 and 80 have predetermined line widths (indicated by arrows 82 and 84). In an exemplary embodiment, the routing lines 78 and 80 have about the same dimension for the predetermined line widths 82 and 84. In one embodiment, the predetermined line widths 82 and 84 are about 40 nm or greater, such as about 50 nm or greater, such as about 60 nm or greater, for example from about 60 to about 100 nm.

The routing lines 78 and 80 overlap to define a stitch 86, forming the B2B route 58 and coupling the border pins 62 and 66. In an exemplary embodiment, the routing lines 78 and 80 overlap a distance (indicated by double headed arrow 86) of about 40 nm or less, for example from about 30 to about 40 nm. Notably, because the predetermined line widths are significantly wider than the critical metal dimensions, often the minimum metal line width, the type of stitch 86 formed by overlapping the edges of the routing lines 78 and 80 define an edge-edge stitch 90. As discussed above, design rules for edge-edge stitches require less overall space and overlap of the routing lines than end-end stitches, which are formed from narrower overlapping routing lines. Therefore, the decomposability of the master pattern layout 50 is less limited compared to other master pattern layouts that include end-end stitches for coupling the border pins.

As illustrated, the tip 91 of the intermediate feature 68 is spaced apart from the edge 92 of the routing line 78 by a distance (indicated by double headed arrow 94) that corresponds to a tip-to-edge minimum space as discussed above without violating the design rules for minimum space between lines. Alternatively, if the intermediate feature was repositioned so that its long axis 96 was parallel to the long axis 70 of the border pin 62, the edge 98 of the intermediate feature 68 could be spaced apart from the edge 92 of the routing line 78 by a distance that corresponds to an edge-to-edge minimum space as discussed above without violating the design rules for minimum space between lines. Thus, the distance that the intermediate feature 68 can be spaced apart from the edge 92 of the routing line 78 is less than if the routing line 78 had a narrower predetermined line width 82, which would require a larger tip-to-tip minimum space without violating the design rules. As such, this configuration helps reduce space between the line features.

The process continues by decomposing the master pattern layout 50 into a sub-pattern 100 and a sub-pattern 102. The sub-pattern 100 includes the border pin 62, the routing line 78, and the intermediate feature 68. The sub-pattern 102 includes the border pin 66 and the routing line 80. Using an appropriate program, a set of mask data 104 is generated corresponding to the sub-pattern 100 and a set of mask data 106 is generated corresponding to the sub-pattern 102. In an exemplary embodiment, the sets of mask data 104 and 106 are provided to a mask of manufacture that produces corresponding photomasks 108 and 110.

FIG. 6 schematically illustrates a further advanced fabrication stage in accordance with an exemplary embodiment. An apparatus 112 includes a photolithography tool 114 that has a light source 116. Arranged in the photolithography tool 114 are the photomasks 108 and 110 that corresponding to sub-patterns 100 and 102, respectively, and the semiconductor substrate 44. Overlying the semiconductor substrate 44 is the semiconductor device layer 42 (e.g., metal layer or other type of semiconductor device layer) and a layer of mask material 120 (e.g., hard mask material such as silicon nitride or the like). The photomasks 108 and 110 are depicted as being positioned side by side in the photolithography tool 114, but those skilled in the art will recognize that the photomasks 108 and 110 may be used in a sequential fashion in a double patterning process in any order. The photolithography tool 114 may be any desired configuration and employ any desire wavelength or form of radiation. The photomasks 108 and 110 are employed in the photolithography tool 114 in a sequence of photolithography operations in which the master pattern layout 50 (see FIGS. 4-5), defined by the combination of the features in both of the photomasks 108 and 110, is patterned or transferred to the layer of mask material 120 to define a double patterned layer of mask material 122.

FIG. 7 illustrates, in plan view, a further advanced fabrication stage in accordance with an exemplary embodiment. Using the double patterned layer of mask material 122 as an etch mask, the semiconductor device layer 42 is etched to transfer the sub-patterns 100 and 102 to the semiconductor device layer 42 to define a patterned semiconductor layer 124. As illustrated, the patterned semiconductor layer 124 corresponds to the master pattern layout 50 formed in a single layer of material. In particular, the patterned semiconductor layer 124 includes the border pins 62 and 66, the routing lines 78 and 80 with the stitch 86, and the intermediate feature 68.

Accordingly, integrated circuits and methods for fabricating integrated circuits using double patterning processes have been described. In an exemplary embodiment, a master pattern layout is created for a semiconductor device layer. The master pattern layout includes a first adjacent cell and a second adjacent cell. The first adjacent cell has a first border pin with a first routing line extending therefrom. The second adjacent cell has a second border pin with a second routing line extending therefrom. The first and second routing lines overlap to form an edge-edge stitch that couples the first and second border pins. Design rules for edge-edge stitches require less overall space and overlap of the routing lines than do end-end stitches, which are formed from narrower overlapping routing lines. Therefore, the decomposability of the master plan layout is less limited compared to other master pattern layout that include end-end stitches for coupling border pins and accordingly, the master plan layout with the edge-edge stitch(es) is more compatible with double patterning processes and results in less routing congestion.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit, the method comprising:
    creating a master pattern layout for a semiconductor device layer, the master pattern layout comprising a first adjacent cell and a second adjacent cell each configured for providing a particular logic function, the first adjacent cell having a first border pin with a first routing line extending therefrom and the second adjacent cell having a second border pin with a second routing line extending therefrom, wherein the first routing line has a first predetermined line width and the second routing line has a second predetermined line width, wherein the first and second predetermined line widths are about 40 nm or greater, and wherein the first and second routing lines overlap to define an edge-edge stitch to couple the first and second border pins, and wherein the edge-edge stitch has a width that corresponds to the first and second predetermined line widths;
    decomposing the master pattern layout into a first sub-pattern and a second sub-pattern, wherein the first sub-pattern comprises the first border pin with the first routing line and the second sub-pattern comprises the second border pin with the second routing line;
    generating a first set of mask data corresponding to the first sub-pattern; and
    generating a second set of mask data corresponding to the second sub-pattern.

2. The method of claim 1, wherein creating the master pattern layout comprises creating the first and second routing lines having about the same dimension for the first and second predetermined line widths.

3. The method of claim 1, wherein creating the master pattern layout comprises creating the first and second routing lines having the first and second predetermined line widths of about 50 nm or greater.

4. The method of claim 1, wherein creating the master pattern layout comprises creating the first and second routing lines having the first and second predetermined line widths of about 60 nm or greater.

5. The method of claim 1, wherein creating the master pattern layout comprises creating the first and second routing lines having the first and second predetermined line widths of from about 60 to about 100 nm.

6. The method of claim 1, wherein creating the master pattern layout comprises forming the edge-edge stitch such that the first and second routing lines overlap by a distance of about 40 nm or less.

7. The method of claim 1, wherein creating the master pattern layout comprises forming the edge-edge stitch such that the first and second routing lines overlap by a distance of from about 5 to about 30 nm.

8. The method of claim 1, wherein creating the master plan layout comprises creating an intermediate feature in the second adjacent cell adjacent to the second border pin on a side opposite the first border pin, wherein the intermediate feature is spaced apart from the first routing line by a distance less than a tip-to-tip minimum space but equal to or greater than an edge-to-edge minimum space or a tip-to-edge minimum space, and wherein decomposing the master pattern layout comprises forming the first sub-pattern comprising the intermediate feature.

9. The method of claim 8, wherein the tip-to-tip minimum space is about 85 nm or greater, the tip-to-edge minimum space is from about 70 to about 80 nm, and the edge-to-edge minimum space is from about 50 to about 70 nm.

10. The method of claim 1, further comprising:
providing the first and second sets of mask data to a mask manufacture.

11. A method for fabricating an integrated circuits, the method comprising:
patterning a layer of mask material overlying a semiconductor device layer using a first photomask and a double patterning process to transfer a first sub-pattern from the first photomask to the layer of mask material, the first sub-pattern comprising a first border pin with a first routing line extending therefrom, wherein the first routing line has a first predetermined line width that is about 40 nm or greater; and
patterning the layer of mask material using a second photomask and the double patterning process to transfer a second sub-pattern from the second photomask to the layer of mask material, the second sub-pattern comprising a second border pin with a second routing line extending therefrom, wherein the second routing line has a second predetermined line width that is about 40 nm or greater, and wherein the layer of the mask material is patterned using the first and second photomasks such that the first and second routing lines overlap to define an edge-edge stitch to couple the first and second border pins, and wherein the edge-edge stitch has a width that corresponds to the first and second predetermined line widths.

12. The method of claim 11, wherein patterning the layer of mask material using the first and second photomasks defines a double patterned layer of mask material, and wherein the method further comprises:
etching into the semiconductor device layer using the double patterned layer of mask material as an etch mask to transfer the first and second sub-patterns to the semiconductor device layer.

13. The method of claim 11, wherein patterning the layer of mask material using the first and second photomasks comprises transferring the first and second routing lines having the first and second predetermined line widths of about 50 nm or greater.

14. The method of claim 11, wherein patterning the layer of mask material using the first and second photomasks comprises transferring the first and second routing lines having the first and second predetermined line widths of about 60 nm or greater.

15. The method of claim 11, wherein patterning the layer of mask material using the first and second photomasks comprises transferring the first and second routing lines having the first and second predetermined line widths of from about 60 to about 100 nm.

16. The method of claim 11, wherein patterning the layer of mask material using the first and second photomasks comprises defining the edge-edge stitch such that the first and second routing lines overlap by a distance of about 40 nm or less.

17. The method of claim 11, wherein the first and second predetermined line widths are about 60 nm or greater.

18. The method of claim 11, wherein the first and second predetermined line widths are from about 60 to about 100 nm.

* * * * *